(12) United States Patent
Sayem et al.

(10) Patent No.: US 11,990,673 B2
(45) Date of Patent: May 21, 2024

(54) ELECTRONIC DEVICE WITH ANTENNA INTEGRATED WITHIN A PHOTOVOLTAIC LAYER

(71) Applicant: Garmin International, Inc., Olathe, KS (US)

(72) Inventors: Abu T. Sayem, Overland Park, KS (US); Juhi H. Godhwani, Lenexa, KS (US); Mohamed Bouchoucha, Les Pennes Mirabeau (FR); Jacob T. Zeller, Spring Hill, KS (US); John M. Kenkel, Kansas City, KS (US); Oliver R. F. Gagliano, Marseilles (FR); Georgios Atmatzakis, Olathe, KS (US); Lionel J. Dupuy, Pourrieres (FR)

(73) Assignee: Garmin International, Inc., Olathe, KS (US)

( * ) Notice: Subject to any disclaimer, the term of this patent is extended or adjusted under 35 U.S.C. 154(b) by 333 days.

(21) Appl. No.: 17/648,888

(22) Filed: Jan. 25, 2022

(65) Prior Publication Data

US 2023/0187822 A1 Jun. 15, 2023

Related U.S. Application Data

(60) Provisional application No. 63/287,864, filed on Dec. 9, 2021.

(51) Int. Cl.
*H01Q 1/44* (2006.01)
*H01L 31/0445* (2014.01)
(Continued)

(52) U.S. Cl.
CPC ........... *H01Q 1/44* (2013.01); *H01L 31/0445* (2014.12); *H01Q 7/00* (2013.01); *H01Q 9/06* (2013.01); *H01Q 13/10* (2013.01)

(58) Field of Classification Search
CPC .. H01Q 1/44; H01Q 7/00; H01Q 9/06; H01Q 13/10; H01Q 1/273; H01Q 9/42; H01Q 13/106; H01L 31/0445; H01L 31/022433
See application file for complete search history.

(56) References Cited

U.S. PATENT DOCUMENTS 7,321,337 B2 * 1/2008 Ikeda ..................... G04R 60/12
343/788
8,493,817 B2 * 7/2013 Baba ..................... G04R 20/04
368/205

(Continued)

FOREIGN PATENT DOCUMENTS

KR 102384176 B1 * 3/2021 ............... H01Q 1/38

*Primary Examiner* — Hai V Tran
*Assistant Examiner* — Michael M Bouizza
(74) *Attorney, Agent, or Firm* — Samuel M. Korte; Max M. Ali (57) ABSTRACT

An electronic device comprises a housing, a display stack, a bezel, a solar cell, and a first antenna. The housing includes a bottom wall and a side wall coupled to the bottom wall, the side wall and the bottom wall define a portion of an internal cavity. The display stack includes a display cover and a solar cell configured to output an electric power having a power level corresponding to an intensity of light received by the solar cell. The bezel is coupled to an upper edge of the side wall of the housing, the bezel enclosing the display cover. The solar cell includes a substrate and a photovoltaic layer, the photovoltaic layer including a mesh of electrically conductive material positioned on the substrate and a first opening. The first antenna is formed by the first opening of the photovoltaic layer.

20 Claims, 6 Drawing Sheets

(51) Int. Cl.
    *H01Q 7/00*     (2006.01)
    *H01Q 9/06*     (2006.01)
    *H01Q 13/10*     (2006.01)

(56) References Cited

U.S. PATENT DOCUMENTS

| | | | |
|---|---|---|---|
| 8,872,711 B2* | 10/2014 | Parsche | H01L 31/0392 |
| | | | 343/872 |
| 10,209,679 B2* | 2/2019 | Fujisawa | G04G 21/04 |
| 10,271,299 B1 | 4/2019 | Sayem et al. | |
| 10,581,145 B2* | 3/2020 | Han | H04B 1/385 |
| 10,734,708 B2 | 8/2020 | Yong et al. | |
| 10,879,597 B2* | 12/2020 | Kang | H01Q 1/243 |
| 10,944,158 B2* | 3/2021 | Sayem | H01Q 5/50 |
| 11,853,015 B2* | 12/2023 | Atmatzakis | G01S 19/14 |
| 2018/0287243 A1* | 10/2018 | Ko | H01Q 5/30 |

* cited by examiner

ELECTRONIC DEVICE WITH ANTENNA INTEGRATED WITHIN A PHOTOVOLTAIC LAYER

RELATED APPLICATIONS

The present patent application claims priority benefit under 35 U.S.C. § 119(e) of U.S. Provisional Patent Application Ser. No. 63/287,864, filed Dec. 9, 2021, and titled "Electronic Device with Antenna Integrated within a Photovoltaic Layer," which is hereby incorporated by reference in its entirety.

BACKGROUND

Conventional electronic devices often include functionality that may be used to track users' current locations, distances traveled, velocities, and other performance metrics or data. This functionality may be provided by receiving positional information from a satellite-based positioning system such as the global navigation satellite system (GNSS). In addition, such devices may communicate wirelessly with other electronic devices, systems, or networks to monitor a user's activities, running or biking performance, upload and download data, receive messages and information, and so forth. The communication protocols utilized to transmit and receive information may include Bluetooth, Wi-Fi, or telecommunication, such as cellular, signaling protocols. The electronic device may include two or more antennas that are utilized to receive signals from GNSS satellites and wirelessly communicate with other electronic devices or telecommunication services.

The conventional electronic devices typically include a housing and a bezel that surrounds the face of the electronic device. In order to avoid interference or signal reduction caused by the electronic components of the device, the antennas are often positioned proximate to a side wall of the housing or are integrated within a bezel of the device. However, the housing and the bezel may be formed from electrically conductive material, such as a metal or a metal alloy, to provide structural strength or a certain aesthetic appearance. Unfortunately, the conductive material of such a housing or bezel may also cause interference or signal reduction to an antenna positioned within or along an outer surface of the conventional device.

SUMMARY

Embodiments of the present technology provide an electronic device that utilizes a solar cell within which one or more antennas are positioned, which may enable use of a housing and a bezel that may be formed of conductive material, such as a metal or a metal alloy. An embodiment of the electronic device broadly comprises the housing, a display stack, the bezel, the solar cell, and a first antenna. The display stack includes a display cover and the solar cell. The housing includes a bottom wall and a side wall coupled to the bottom wall. The side wall and the bottom wall define a portion of an internal cavity and the bezel is coupled to an upper edge of the side wall of the housing and encloses the display cover. The solar cell includes a substrate and a photovoltaic (PV) layer configured to output an electric power having a power level corresponding to an intensity of light received by the solar cell. The photovoltaic layer includes a first opening. The first antenna is configured to transmit wireless signals, receive wireless signals, or transmit and receive wireless signals and is formed by the first opening of the photovoltaic layer.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present technology will be apparent from the following detailed description of the embodiments and the accompanying drawing figures.

BRIEF DESCRIPTION OF THE DRAWING FIGURES

Embodiments of the present technology are described in detail below with reference to the attached drawing figures, wherein.

The drawing figures do not limit the present technology to the specific embodiments disclosed and described herein. While the drawings do not necessarily provide exact dimensions or tolerances for the illustrated components or structures, the drawings are to scale as examples of certain embodiments with respect to the relationships between the components of the structures illustrated in the drawings.

DETAILED DESCRIPTION

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the present technology. The following detailed description is, therefore, not to be taken in a limiting sense. The scope of the present technology is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Relational terms, such as "above", "below", "over", "beneath", "upper", "upward", "lower", "downward", "top", "bottom", "outer", "inner", etc., may be used throughout this description. These terms are used with reference to embodiments of the technology and the orientations and relative positionings of the components thereof shown in the accompanying figures. Embodiments of the technology may be oriented and/or positioned in ways other than those shown in the figures. Therefore, the terms do not limit the scope of the present technology.

Embodiments of the present technology relate to an electronic device that communicate wirelessly with other devices, systems, and networks. In embodiments, the electronic device may be a fitness watch, a wrist-worn smart phone, a wrist-worn navigation device, or other wearable multi-function electronic devices that include a housing and a wrist band, strap, or other attachment mechanism enabling the electronic device to be worn on a wrist or other parts of the body, such as the forearm or the upper arm. It is to be understood that the electronic device may also be handheld, mounted or used in any other manner. For instance, the electronic device may be handheld or mounted for use indoors or outdoors. In embodiments, the electronic device may be mounted to the handlebar of a bicycle or to a component of an automobile or a marine vessel, such as a dashboard or a windshield, enabling its display to be viewed by the user while engaged in an activity or while operating a vehicle or boat.

The electronic device may be used to monitor the user's current location, distance traveled, velocity, and other performance metrics by receiving location signals from a satellite-based positioning system such as the global navigation satellite system (GNSS). The electronic device may be electronically paired with other devices such as a heart rate monitor worn around the user's chest, a foot pod attached to the user's shoe for measuring jogging or running cadence and distance, a bike speed and cadence sensor attached to a crank arm and wheel hub of the user's bicycle for tracking biking performance, and so forth. Furthermore, the electronic device may be able to communicate with smartphones, tablets, laptop or desktop computers, WiFi routers, cell towers, and the like to allow the user to upload activity data, download apps, download or stream music, receive text messages, emails, and weather alerts, and so on. Thus, the electronic device may utilize or process signals with GNSS protocols, Bluetooth™, WiFi, or cellular telecommunication protocols, and so forth. Accordingly, the electronic device includes one or more antennas to transmit and/or receive the wireless signals associated with these protocols.

Conventional devices having a body or a bezel formed of electrically conductive materials may experience substantial interference caused by the operation of antennas positioned along or proximate to the electrically conductive body or bezel of the device and such interference may adversely affect performance of the antennas to such an extent that positioning the antennas along or proximate to the housing or the bezel of the device is impractical.

The electronic device of the present technology positions a first antenna and a second antenna each within an opening of a photovoltaic layer to enable the electronic device to utilize any material for its housing and its bezel. In embodiments, the electronic device comprises a solar cell positioned in a housing incorporating the first antenna, configured to wirelessly receive location signals, and the second antenna, configured to wirelessly transmit and receive communications signals for one or more communication protocols. The housing of the electronic device may have a unibody construction and may be formed of electrically conductive materials, such as a metal, a metal alloy or a combination thereof. In such embodiments having a unibody construction, a bottom wall of the housing may also be formed of an electrically conductive material, such as a metal or a metal alloy. The electronic device may also include a bezel that encloses a display cover and that may also be formed of electrically non-conductive material, such as a plastic, or electrically conductive material, such as a metal or a metal alloy. The electronic device may include a display stack that includes a plurality of components, such as the display cover, a solar cell that includes a substrate and the photovoltaic layer that is positioned on the substrate, and a display that presents information to a user. It is to be understood that the electronic device may be a wrist-worn electronic device with a watch face, a handheld device, a mounted device or any other device including a solar cell having a substrate and a photovoltaic layer.

The solar cell is configured to receive sunlight or ambient light and generate electric power, which can be used to re-charge a battery within the electronic device that is a source of electrical power for components of the electronic device. The solar cell includes the substrate and the photovoltaic layer deposited on the substrate. The substrate is formed from any electrically insulating material, such as a glass or a plastic, that may receive deposits of the photovoltaic layer. The photovoltaic layer is formed from one or more sublayers of electrically conductive and semiconductive material including a transparent conductive oxide (TCO) layer, an absorber layer and a conductive (e.g., metal) layer and then photolithography, screen-printing and/or ink-jet techniques are used to etch (remove) from the substrate the layers of the deposited photovoltaic layer from a plurality of areas to form a mesh, grid, or crosshatch pattern of the photovoltaic layer that remains deposited on the substrate.

Positioning of the first antenna and the second antenna in the photovoltaic layer separates the antennas from interior surfaces of the housing and the bezel. As a result, embodiments of the present invention enable the electronic device to incorporate a housing and a bezel formed of electrically conductive material, nonconductive material or any combination thereof. For instance, the electronic device may include a unibody housing and a bezel formed of electrically conductive material, such as a metal, while also having a first antenna that is configured to receive location signals as well as a second antenna that is configured to wirelessly transmit and receive communication signals.

In embodiments, one or more slot antennas may be formed by one or more opening formed in the photovoltaic layer such that each opening may directly form a radiating element for each antenna. In embodiments having two openings formed within the photovoltaic layer, a first opening may form a first slot antenna and the second opening may form a second slot antenna. In embodiments, the one or more openings may be covered by other layers of the display stack and not contain anything other than air such that a void having a partial annular shape or a rectangular shape is formed in the photovoltaic layer. In other embodiments, the one or more openings may be filled with a combination of electrically insulating materials that provide structural support for each opening and has a transparency that is similar to a transparency of the photovoltaic layer to reduce visibility of each opening such that each opening is not visibly obvious or discernable to the user.

In other embodiments, each opening within the photovoltaic layer may provide a space (area) within which a radiating element of a first antenna, such as an inverted-F type antenna, may be positioned on portions of the photovoltaic layer that have not been removed.

Figure 5:
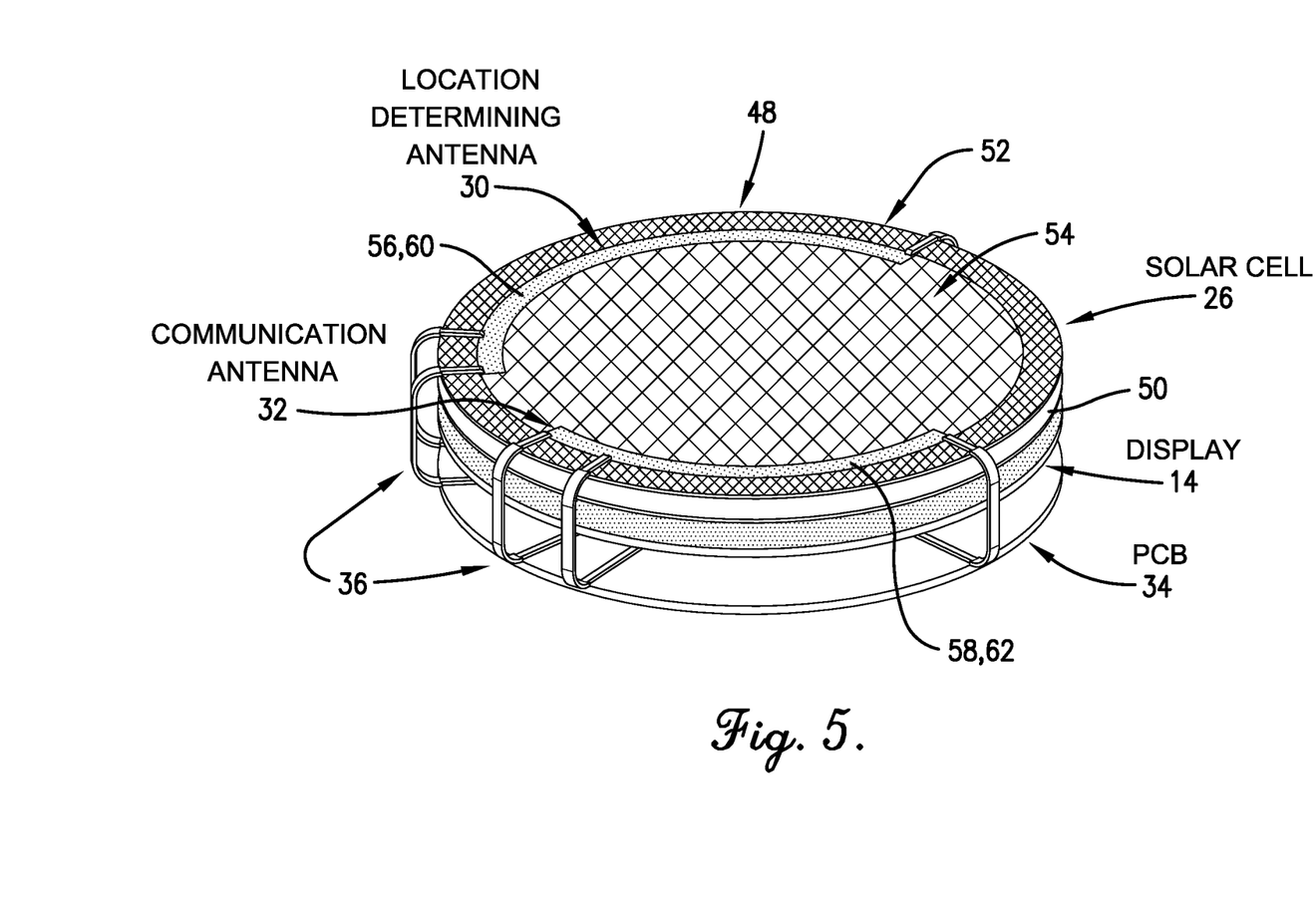
FIG. 5 is an upper perspective view of the solar cell, a display, and a printed circuit board (PCB)

Embodiments of the technology will now be described in more detail with reference to the drawing figures. Referring initially to FIGS. 1A, 1B, 2A, 2B, and 3, an exemplary wrist-worn electronic device 10 is illustrated. The electronic device 10 broadly comprises a housing 12, a bezel 44, a display cover 46, a display 14, a user interface 16, a location determining element 18, a communication element 20, a memory element 22, a processing element 24, a solar cell 26, power supply circuitry 28, a location determining antenna 30, and a communication antenna 32. The display cover 46 corresponds to an outer surface of the display stack in external views of the electronic device 10. The communication of information, signals and data between the electronic components is illustrated schematically in FIGS. 2A and 2B. Referring to FIG. 5, the electronic device 10 may further comprise a printed circuit board 34 and electrical connectors 36 that extend between the printed circuit board 34 and each opening of the photovoltaic layer. The electronic device 10 may also include a wrist band, a strap, or other attachment mechanisms to secure the electronic device 10 to a user's wrist or body.

Figure 1A:
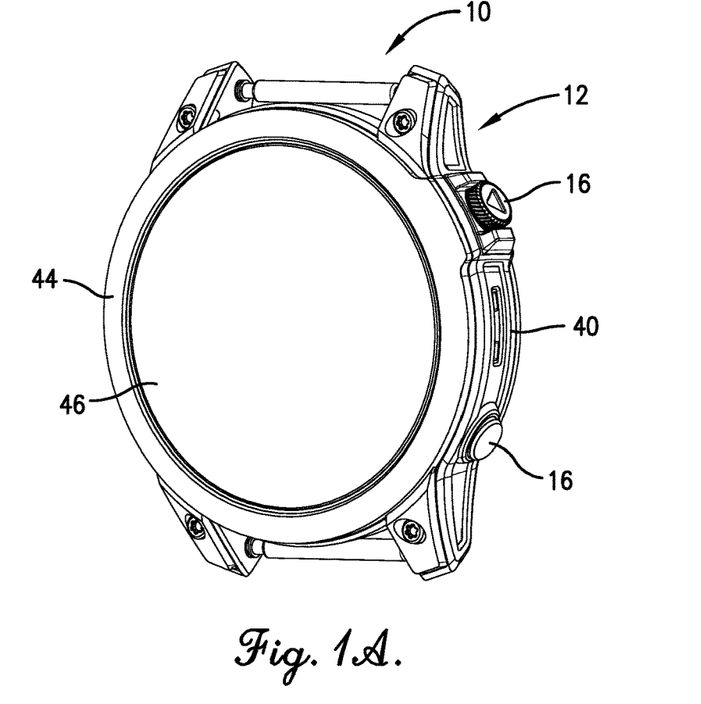
FIG. 1A is an upper perspective view of a wrist-worn electronic device, constructed in accordance with various embodiments of the present technology.
Figure 1B:
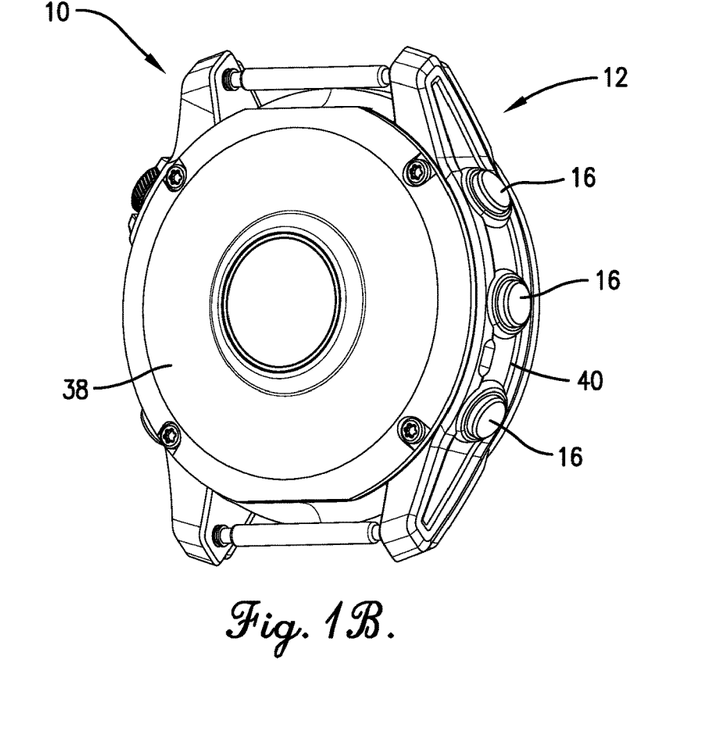
FIG. 1B is a lower perspective view of the wrist-worn electronic device.
Figure 2A:
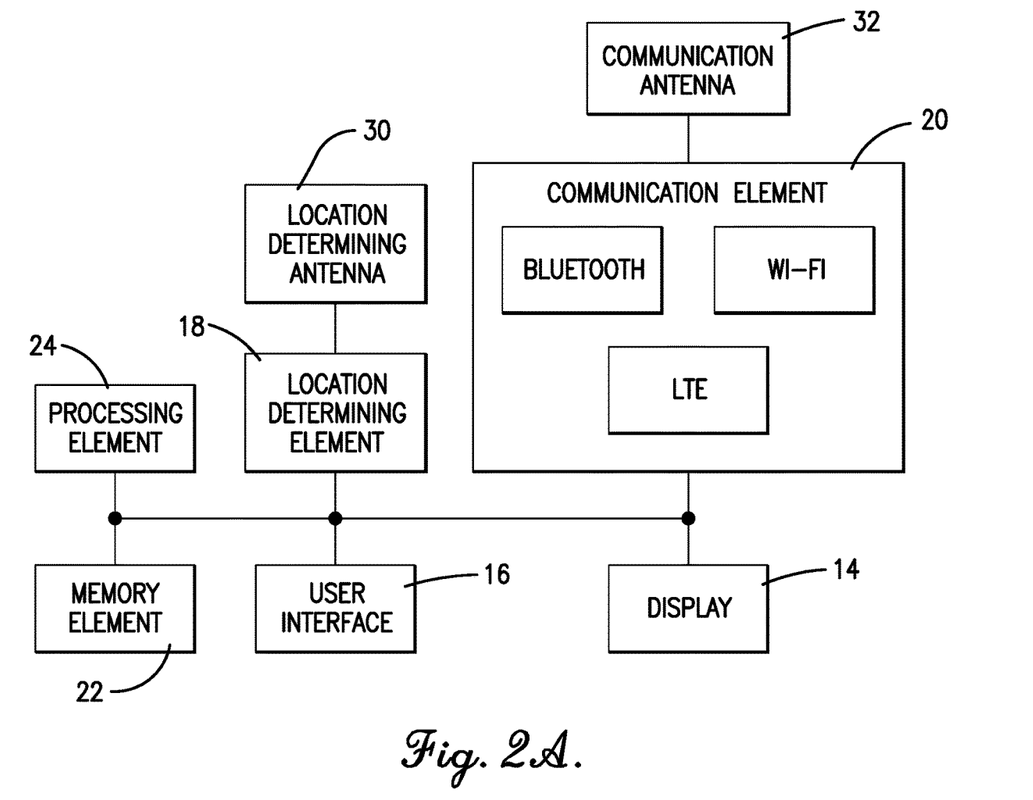
FIG. 2A is a schematic block diagram of various electronic components of the electronic device.
Figure 2B:
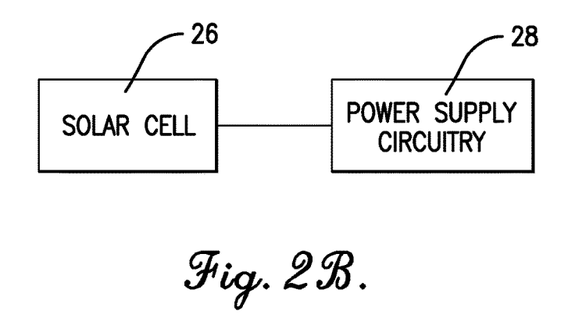
FIG. 2B is a schematic block diagram of additional electronic components of the electronic device.
Figure 3:
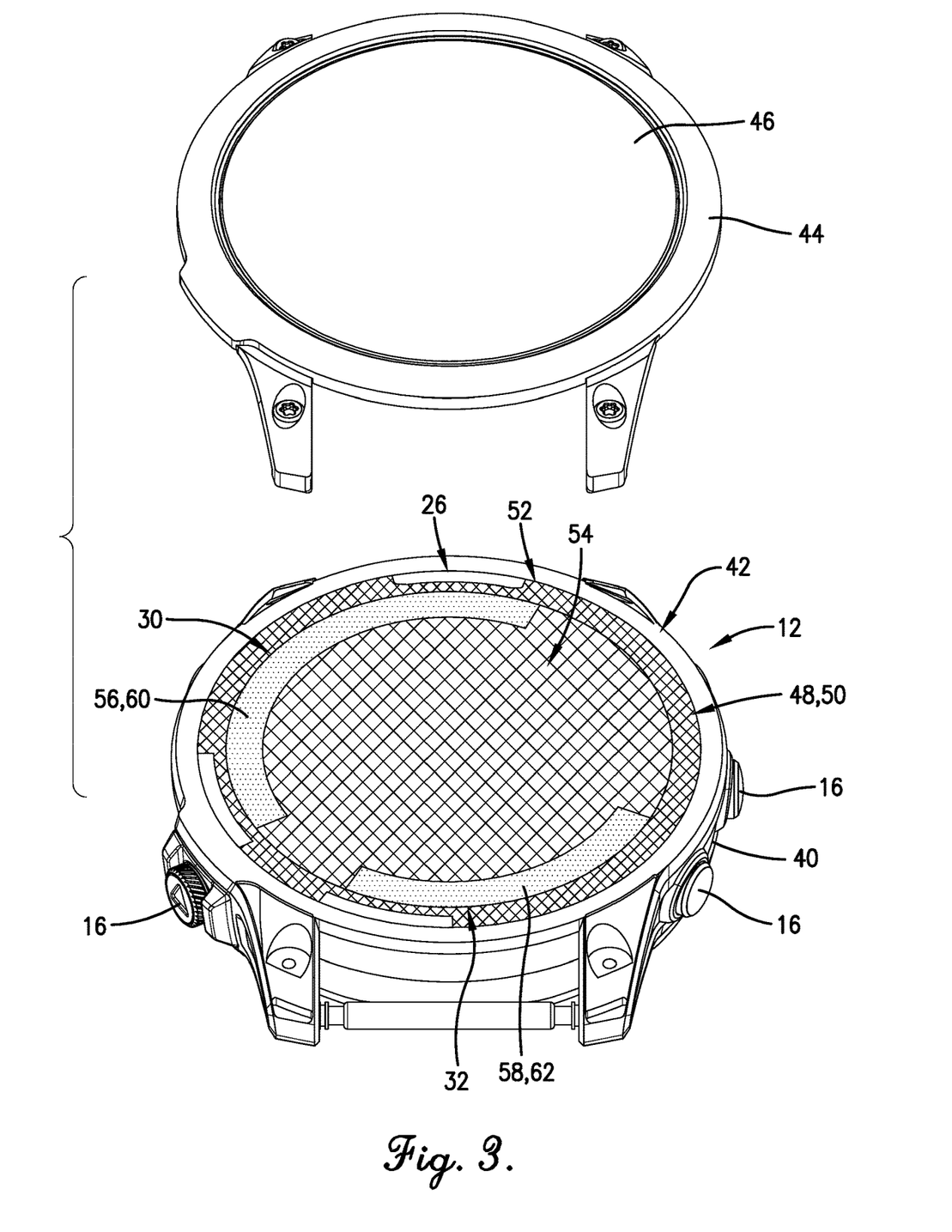
FIG. 3 is an upper perspective view of the wrist-worn electronic device with a bezel and a glass cover removed to reveal an internal cavity that includes a solar cell.

The housing 12, shown in FIGS. 1A, 1B, and 3, generally houses or retains other components of the electronic device 10 and may include or be coupled to the wrist band. The housing 12 may have a unibody structure, wherein the bottom wall 38 and the side wall 40 are a single unit, or a structure where the bottom wall 38 is coupled to the side wall 40. The housing 12 may include a bottom wall 38, at least one side wall 40, and an internal cavity 42. The bottom wall 38 includes a lower, outer surface that contacts the user's wrist while the user is wearing the electronic device 10. The side wall 40 couples to the bottom wall 38 at a lower edge of the side wall 40. The bottom wall 38 defines a lower portion of the internal cavity 42. An upper edge of the one or more side walls 40 of the housing 12 may be coupled with a lower surface of the bezel 44. An opening formed by the bezel 44 may expose the display cover 46.

In exemplary embodiments that are shown in the figures, the display cover 46 is circular in shape and the housing 12 includes a single side wall 40, with an inner surface, an opposing outer surface, and an upper surface. The one or more side walls 40 are positioned to form a circular or ring shape that generally forms and defines a portion of the internal cavity 42. In other embodiments, the shape of the display cover 46 may be square or rectangular in shape and a plurality of side walls 40 may be positioned to form the square or rectangular shape that generally forms and defines a portion of the internal cavity 42. In still other embodiments, depending on the shape of the display cover 46, which generally corresponds to the shape of display 14, the housing 12 may include a plurality of side walls 40 positioned to form other geometric or polygonal shapes, such as triangular, oval or elliptical, hexagonal, octagonal, and so forth.

In exemplary embodiments, the one or more side walls 40 include one or more through holes extending from the inner surface to the outer surface of one or more side walls 40. Components of the user interface 16, such as pushbuttons, rotary knobs, or the like, may be positioned in the through holes.

The housing 12 may be formed of electrically conductive materials (e.g., metals, metal alloys, etc.), non-metallic materials (e.g., plastic, rubber, glass, nylon, foam, polymers, silicone, vinyl, etc.) or a combination thereof. Similarly, the bezel 44 may be formed of electrically conductive materials (e.g., metals, metal alloys, etc.), non-metallic materials (e.g., plastic, rubber, glass, nylon, foam, polymers, silicone, vinyl, etc.) or a combination thereof.

The housing 12 may be coupled to a bezel 44 that surrounds a display cover 46, which is positioned above a display 14 and forms an outer surface of the display stack. The bezel 44 is generally annular or ring shaped and has an inner circumference edge and an outer circumference edge. The bezel 44 may be coupled to the upper surface or upper edge of the one or more side walls 40. The display cover 46 may be formed of electrically insulating and substantially transparent materials, such as glass, that enables the display 14 to be seen by the user. The display cover 46 may also include a lens or have a lens effect to improve the visibility of the display 14. In embodiments where the display 14 and the display stack are substantially circular, the display cover 46 generally has a corresponding circular or disc shape and a rounded outer circumferential edge. In embodiments where the display 14 and the display stack are square or rectangular, the display cover 46 generally has a corresponding square or rectangular shape and a straight outer circumferential edge. The outer circumferential edge of the display cover 46 is coupled to the inner circumferential edge of the bezel 44 or under a lower surface of the bezel 44.

The display 14 of the display stack presents information to the user, such as time of day, current location, and the like. The display 14 may be implemented in one of the following technologies: light-emitting diode (LED), organic LED (OLED), Light Emitting Polymer (LEP) or Polymer LED (PLED), liquid crystal display (LCD), thin film transistor (TFT) LCD, LED side-lit or back-lit LCD, or the like, or combinations thereof. In exemplary embodiments that are shown in the figures, the display cover 46 and the display 14 has a round or circular shape. In general, the display cover 46 and the display 14 may possess a shape that corresponds to the housing shape formed by the one or more side walls 40 of the housing 12 and the inner circumferential edge of the bezel 44. The display 14 may be in electronic communication with the memory element 22 and the processing element 24 and may receive data or information therefrom that is to be presented on the display 14. The display 14 is positioned above the printed circuit board 34 and below the solar cell 26 and the display cover 46. The display 14 is part of the display stack, a portion of which may be positioned within the internal cavity 42 of the housing 12.

The user interface 16 generally allows the user to interact with the electronic device 10 and may include pushbuttons, rotary knobs, or the like. In exemplary embodiments of FIGS. 1A, 1B, and 3, the housing 12 may include one or more pushbuttons and/or rotary knobs located in the through holes of the side wall 40 that function as at least a portion of the user interface 16. The user interface 16 may allow the user to scroll through menus or change screens in order to control the function or operation of the electronic device 10.

The location determining element 18 generally determines a current geolocation of the electronic device 10 and may receive and process radio frequency (RF) location signals from a multi-constellation global navigation satellite system (GNSS) such as the global positioning system (GPS), the GLONASS system, the Galileo system, or the like. The location determining element 18 may include satellite navigation receivers, processors, controllers, other computing devices, or combinations thereof, and memory. The location determining element 18 may process an electronic location signal communicated from the location determining antenna 30 which wirelessly receives the location signal from one or more GNSS satellites. The location signal includes data from which geographic information such as the current geolocation is derived. The current geolocation may include coordinates, such as the latitude and longitude, of the current location of the electronic device 10. The location determining element 18 may communicate the current geolocation to the processing element 24, the memory element 22, or both.

Although embodiments of the location determining element 18 may include a satellite navigation receiver, it will be appreciated that other location-determining technology may be used. For example, cellular towers or any customized transmitting radio frequency towers can be used instead of satellites to determine the location of the electronic device 10 by receiving data from at least three transmitting locations and then performing basic triangulation calculations to determine the relative position of the device with respect to the transmitting locations. With such a configuration, any standard geometric triangulation algorithm can be used to determine the location of the electronic device 10. The location determining element 18 may also include or be coupled with a pedometer, accelerometer, compass, or other dead-reckoning components which allow it to determine the location of the electronic device 10. The location determining element 18 may determine the current geographic location through a communications network, such as by using Assisted GPS (A-GPS), or from another electronic device. The location determining element 18 may even receive location data directly from a user.

The communication element 20 is electrically coupled with the processing element 24 as well as the memory element 22 and generally allows the electronic device 10 to communicate with other electronic devices, external systems, networks, and the like. The communication element 20 each may include signal and/or data transmitting and receiving circuits, such as amplifiers, filters, mixers, oscillators, digital signal processors (DSPs), and the like that process radio frequency (RF) electronic signals which include data transmitted and received using various communication standards. The communication element 20 processes a communication signal by decoding data that has been received and encoding data to be transmitted wirelessly. The communication electronic signal is communicated, or electronically coupled, between the communication element 20 and the communication antenna 32.

The communication element 20 may utilize telecommunication standards such as cellular telecom 3G, 4G, LTE, or 5G, an Institute of Electrical and Electronics Engineers (IEEE) 802.11 standard such as WiFi, IEEE 802.16 standard such as WiMAX, Bluetooth™, or combinations thereof. In addition, the communication element 20 may utilize communication standards such as ANT, ANT+, Bluetooth™ low energy (BLE), the industrial, scientific, and medical (ISM) band at 2.4 gigahertz (GHz), or the like.

In various embodiments, the electronic device 10 may be configured to establish communication using a plurality of communication protocols or standards with exercise-related sensors, such as a foot pod, a bike speed and cadence sensor, or the like, with other electronic devices, such as a smartphone, a tablet, a laptop, or a desktop computer, or with service providers through routers, switches, hubs, access points, cell towers, and so forth. The communication element 20 may include a transceiver configured to utilize one or more protocols or standards, such as Bluetooth™, WiFi, cellular telecom (including 4G, LTE, 5G, etc.), or the like, enabling the electronic device 10 to communicate with other devices, external systems, networks, and the like.

The memory element 22 may be embodied by devices or components that store data in general, and digital or binary data in particular, and may include exemplary electronic hardware data storage devices or components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, solid state memory, or the like, or combinations thereof. In some embodiments, the memory element 22 may be embedded in, or packaged in the same package as, the processing element 24. The memory element 22 may include, or may constitute, a non-transitory "computer-readable medium". The memory element 22 may store the instructions, code, code statements, code segments, software, firmware, programs, applications, apps, services, daemons, or the like that are executed by the processing element 24. The memory element 22 may also store data that is received by the processing element 24 or the device in which the processing element 24 is implemented. The processing element 24 may further store data or intermediate results generated during processing, calculations, and/or computations as well as data or final results after processing, calculations, and/or computations. In addition, the memory element 22 may store settings, text data, software, software applications, files, image data, databases, and the like.

The processing element 24 may comprise one or more processors. The processing element 24 may include electronic hardware components such as microprocessors (single-core or multi-core), microcontrollers, digital signal processors (DSPs), field-programmable gate arrays (FPGAs), analog and/or digital application-specific integrated circuits (ASICs), or the like, or combinations thereof. The processing element 24 may generally execute, process, or run instructions, code, code segments, code statements, software, firmware, programs, applications, apps, processes, services, daemons, or the like. The processing element 24 may also include hardware components such as registers, finite-state machines, sequential and combinational logic, configurable logic blocks, and other electronic circuits that can perform the functions necessary for the operation of the current invention. In certain embodiments, the processing element 24 may include multiple computational components and functional blocks that are packaged separately but function as a single unit. In some embodiments, the processing element 24 may further include multiprocessor architectures, parallel processor architectures, processor clusters, and the like, which provide high performance computing. The processing element 24 may be in electronic communication with the other electronic components of the electronic device 10 through serial or parallel links that include universal busses, address busses, data busses, control lines, and the like. The processing element 24 may be operable, configured, or programmed to perform the functions, processes, or methods associated with the current technology and described herein by utilizing hardware, software, firmware, or combinations thereof. The processing element 24 may be electrically coupled with other components, such as the location determining element 18, the communication element 20, and the memory element 22, which may be utilized with executing or processing information and data as well.

The solar cell 26, as shown in FIGS. 3-6, receives light, such as sunlight or ambient light in the vicinity of the electronic device 10, and generates an electric power (electric voltage and/or electric current). The electric power output by the solar cell 26 has a power level that corresponds to an intensity of light received by the solar cell 26. The power level of the electric power output by the solar cell 26 may also correspond to an energy level of light received by the solar cell 26.

The solar cell 26 includes substrate 50 and the photovoltaic layer 48 positioned on the substrate 50. The substrate 50 may be formed from any electrically insulating material, such as a glass or a plastic, that may receive deposits of photovoltaic layer 48. In embodiments where the display 14 is substantially circular, the photovoltaic layer 48 and the substrate 50 each substantially have a disc or circular wafer shape. The photovoltaic layer 48 may be formed from a plurality of sublayers stacked one on top of another. One or more sublayers of the photovoltaic layer 48 include an electrically conductive sublayer formed from metals, metal alloys, and/or metal oxides, an absorber sublayer formed from semiconductor material, and a transparent conductive oxide (TCO) sublayer formed one or more metals, metal alloys, and/or metal oxides. In embodiments where the display 14 is square or rectangular, the photovoltaic layer 48 and the substrate 50 have a corresponding square or rectangular wafer shape.

In embodiments, the photovoltaic layer 48 may be deposited on the substrate 50 in a plurality of layers including the transparent conductive oxide (TCO) layer, the absorber layer and the conductive (e.g., metal) layer and then the deposited sublayers of the photovoltaic layer 48 are etched (removed) from a plurality of portions of substrate 50 using photolithography, screen-printing and/or inkjet techniques to form a mesh, grid, or crosshatch pattern for the photovoltaic layer 48 of the solar cell 26. Thus, the photovoltaic layer 48 of the solar cell 26 includes a plurality of spaced apart first lines formed from the stack of sublayers and a plurality of spaced apart second lines formed from the stack of sublayers, wherein the first lines intersect the second lines in a substantially orthogonal manner.

The solar cell 26 may also include a plurality of regions each having a different level of transparency. For example, as shown in FIGS. 3-6, the photovoltaic layer 48 of the solar cell 26 includes a first region 52 that has a first level of transparency, a second region 54 that has a second level of transparency and one or more openings, such as a first opening 56 and a second opening 58, having a third level of transparency. In embodiments, the first region 52 has a higher density of the mesh of electrically conductive material than the second region 54 and the mesh of electrically conductive material in the first region 52 generates substantially more electric power than the second region 54. Accordingly, the first level of transparency for the first region 52 is relatively low and is less than the second level of transparency for the second region 54, which is relatively high, and the third level of transparency for the first opening 56 and the second opening 58. The different density levels of the mesh of the photovoltaic layer 48 results in areas of some areas of the solar cell 26 generating more electric power than other areas of the solar cell 26. The first opening 56 and the second opening 58 as well as the lower density of the mesh of electrically conductive material in the second region 54 enables information presented on display 14 to be seen by the user with minimal obstruction caused by the photovoltaic layer 48. The density level of the mesh in the first region 52 is substantially greater than a density of the mesh in the second region 54, which does not generate as much electric power as the first region 52.

In embodiments, the first region 52 is substantially annular or ring shaped along a perimeter of substrate 50 and the display cover 46. The first region 52 includes an outer circumferential edge and a spaced apart inner circumferential edge, where the spacing between the circumferential edges correspond to a width of the first region 52. In embodiments, a mask or film that allows light to pass may be applied to display cover 46 to cover or conceal the first region 52, which may restrict or block information presented on the display 14 to be seen by the user. The second region 54 is enclosed by the first region 52 and, in embodiments having a circular display cover 46, the second region 54 is substantially circular or disc shaped.

Figure 4:
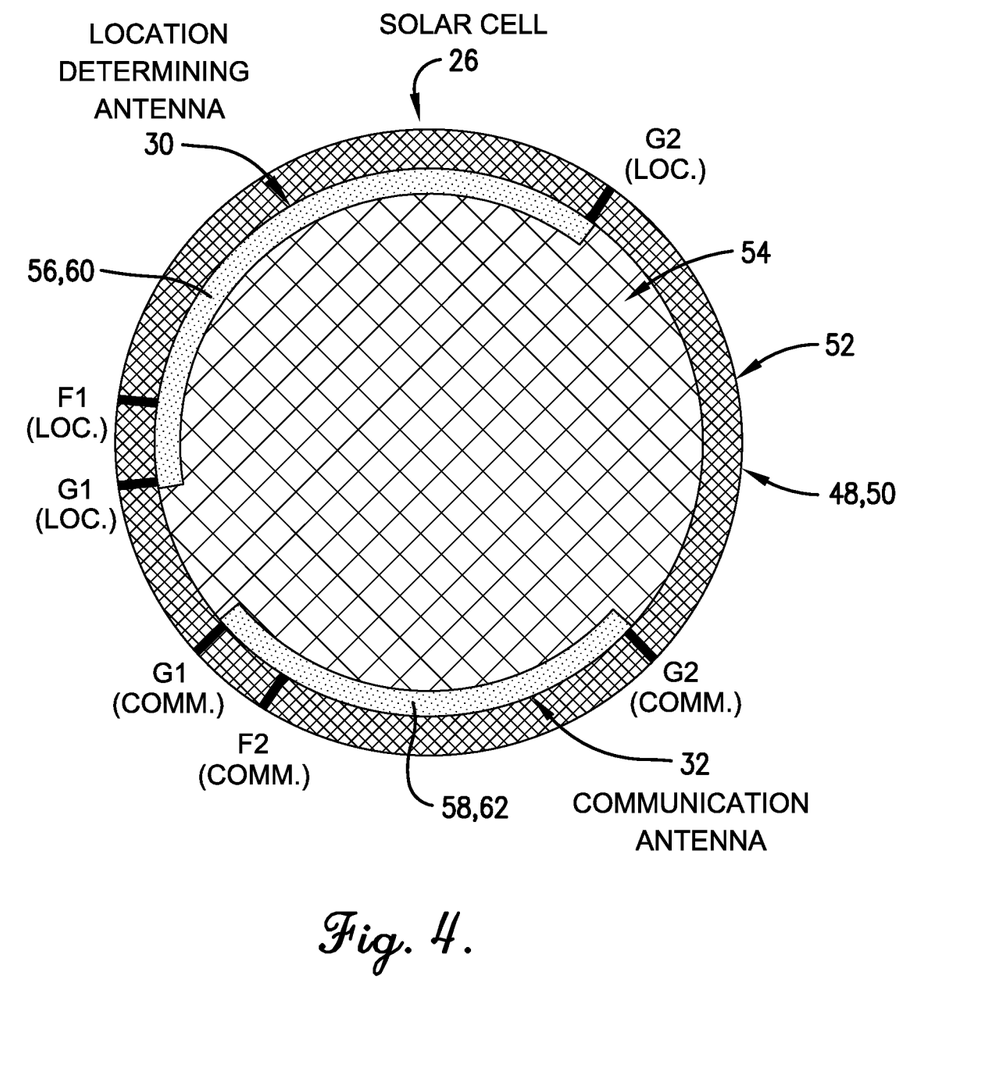
FIG. 4 is a top view of the solar cell including a photovoltaic layer and a first embodiment of a location determining antenna and a communication antenna.

The second region 54 of the photovoltaic layer 48 further includes a first opening 56 that is associated with the location determining antenna 30. In embodiments, the second region 54 of the photovoltaic layer 48 also includes a second opening 58 that is associated with the communication antenna 32. In embodiments, as shown in FIGS. 4 and 5, first opening 56 and second opening 58 each have a partial annular shape including opposing end edges, an outer edge, and a spaced apart inner edge. For instance, the first opening 56 may be positioned within the photovoltaic layer 48 above the substrate 50 such that the outer edge of the first opening 56 is adjacent or proximate to a first location on the inner circumferential edge of the first region 52 of the photovoltaic layer 48. Similarly, the second opening 58 may be positioned within the photovoltaic layer 48 above the substrate 50 such that the outer edge of the second opening 58 is also adjacent or proximate to a second location on the inner circumferential edge of the first region 52 of the photovoltaic layer 48.

As shown in FIGS. 4 and 5, the first location may be spaced apart from and not proximate to the second location to reduce interference between the location determining antenna 30 and communication antenna 32. For instance, the first location may be in an area that is substantially opposite the second location. Alternatively, in some embodiments, the first location may be in an area that is proximate to the second location, provided that an adequate separation distance exists between the location determining antenna 30 and communication antenna 32 to reduce interference. However, it is to be understood that the first opening 56 and the second opening 58 may each be of any shape and in any location of the photovoltaic layer 48. For instance, the first location and the second location for the first opening 56 and the second opening 58, respectively, may both be positioned in an upper region of the watch face, in a lower region of the watch face, or in a side region of the watch face.

In embodiments, the first opening 56 and the second opening 58 may be covered by other layers of the display stack and not contain anything other than air such that a void having a partial annular shape or a rectangular shape is formed in the photovoltaic layer 48. In other embodiments, the first opening 56 and the second opening 58 may each be filled with an electrically insulating material that provides structural support for each opening and has a transparency that is similar to a transparency of the adjacent photovoltaic layer 48 to reduce the visibility of each opening such that each opening is not visibly obvious or discernable to the user. For instance, first opening 56 and the second opening 58 within the photovoltaic layer 48 may include a first filler 60 and a second filler 62, respectively, formed from a substantially electrically non-conductive material, such as a photoresin, paste or ink. The first filler 60 may be positioned in, and occupy the empty space of, the first opening 56 and the second filler 62 may be positioned in, and occupy the empty space of, the second opening 58. In embodiments, the first filler 60 and the second filler 62 may each have a level of transparency that is roughly equal to the second level of transparency of the second region 54 of the photovoltaic layer 48 to reduce the visibility of each opening such that each opening is not visibly obvious or discernable to an observer.

The power supply circuitry 28 generally provides electric power for the electronic device 10. The power supply circuitry 28 may include a battery, voltage regulators, current regulators, conversion circuits, level shifting circuits, and the like. The power supply circuitry 28 receives the electric voltage and/or electric current output by the solar cell 26 that is utilized to charge or re-charge the battery and power components of the electronic device 10.

Each of the location determining antenna 30 and the communication antenna 32 converts wireless RF electromagnetic radiation (a wireless signal) at a particular frequency, i.e., a resonant frequency, into a corresponding electronic signal received and processed by the electronic device 10. Similarly, the location determining antenna 30 and the communication antenna 32 may convert an electronic signal output by the electronic device 10 into a corresponding wireless signal. As shown in FIGS. 3-5, the location determining antenna 30 and the communication antenna 32 are formed by the first opening 56 and the second opening 58, respectively, within the photovoltaic layer 48 of the solar cell 26. In a first embodiment as shown in FIGS. 3-5, each of the location determining antenna 30 and the communication antenna 32 is implemented as a slot antenna. Typically, a slot antenna includes a slot or aperture that is formed and enclosed by electrically conductive material and may have any shape. For example, as shown in FIGS. 3-5, the location determining antenna 30 and the communication antenna 32 may have the partial annular shape with an arc length associated with a wavelength of signal desired to be transmitted or received by each antenna. Similarly, in embodiments where the location determining antenna 30 and the communication antenna 32 may have a substantially rectangular shape, the length of each antenna is associated with a wavelength of signal desired to be transmitted or received by each antenna.

Regardless of whether the location determining antenna 30 and the communication antenna 32 are rectangular or partial annular in shape, the slot has a circumference formed by a length and a width of the first opening 56 and the second opening 58, respectively. The length or the arc length of the first opening 56 and the second opening 58 is proportional to, corresponds to, varies according to, or is approximately equal to, a wavelength, or a portion thereof, such as a one-half wavelength, of the wireless signal that is desired to be transmitted or received by the location determining antenna 30 and the communication antenna 32, respectively.

The location determining antenna 30 generally receives location wireless signals. Exemplary embodiments of the location determining antenna 30 are configured to receive location signals in the GPS L1 band that have a center frequency of approximately 1575 MHz. In addition, the exemplary location determining antenna 30 is configured to have a length that is substantially one-half wavelength of the location signal. Thus, the length or arc length of the first opening 56 associated with the location determining antenna 30 is approximately one-half the wavelength of the 1575 MHz location signal. However, given that the location determining antenna 30 is utilized with an electronic device 10 that is generally worn on a user's wrist and that the diameter of the electronic device 10 is limited, the first opening 56 forming the location determining antenna 30 may have a partial annular shape to fit within the photovoltaic layer of the display stack of the electronic device 10. An arc length of the first opening 56 extending between the outer edge and the inner edge of the first opening 56 may be approximately one-half of the wavelength of the location signal.

Similarly, the communication antenna 32 may be configured to transmit or receive mid band LTE wireless signals having frequencies of approximately 1700 MHz and the exemplary communication antenna 32 have a length that is substantially one-half of a wavelength of the LTE communication signal. As the communication antenna 32 generally wirelessly transmits and receives communication signals, such as Bluetooth™, WiFi, cellular telecom or the like. Thus, the length or arc length of the second opening 58 associated with the communication antenna 32 is approximately one-half the wavelength of the 1700 MHz LTE communication signal. The length or arc length of the slot of the communication antenna 32 is proportional to, corresponds to, varies according to, or is approximately, the wavelength, particularly the half wavelength, of the desired communication protocol. As with the location determining antenna 30, the diameter of the electronic device 10 may be limited and the second opening 58 forming the communication antenna 32 may have a partial annular shape to fit within the photovoltaic layer of the display stack of the electronic device 10. An arc length of the second opening 58 extending between the outer edge and the inner edge of the second opening 58 may be approximately one-half of the wavelength of the communication signal.

In general, the width of a slot antenna determines impedance matching characteristics of the antenna. Exemplary embodiments of the location determining antenna 30 and the communication antenna 32 are configured to have a width of the first opening 56 and the second opening 58, respectively, to achieve a 50-ohm impedance match. The width (i.e., the distance between the outer edge and the inner edge) of the first opening 56 and the second opening 58 of the location determining antenna 30 and the communication antenna 32, respectively, is selected to provide a 50-ohm impedance match.

Referring to FIG. 4, the location determining antenna 30 includes an electrical ground G1 (loc.) connection and an electronic ground G2 (loc.) to the first opening 56 at, or adjacent to, one of the end edges thereof. The location determining antenna 30 includes a signal feed F1 (loc.) electrically connected to the first opening 56 at a point that is spaced apart from the electrical ground G1 (loc.) connection and the electrical ground G2 (loc.) connection. The signal feed F1 (loc.) provides the location signal that is communicated to the location determining element 18. Similarly, the communication antenna 32 includes an electrical ground G1 (comm.) and G2 (comm.) connections to the second opening 58 at, or adjacent to, one of the end edges thereof. The communication antenna 32 includes a signal feed F2 (comm.) electrically connected to the second opening 58 at a point that is spaced apart from the electrical ground G1 (comm.) and the electrical ground G2 (comm.). The signal feed F2 (comm.) provides the communication signal that is transmitted or received by the communication element 20.

The printed circuit board 34 (PCB), as shown in FIG. 5, generally retains electronic components of the electronic device 10, such as the location determining element 18, the communication element 20, the memory element 22, and the processing element 24. The printed circuit board 34 may be of generally known construction with a first side and an opposing second side. The printed circuit board 34 may also include multiple electrically conductive layers with a top conductive layer placed on the first side, a bottom conductive layer placed on the second side, one or more inner conductive layers positioned between the first and second sides, and an insulating layer between each pair of adjacent conductive layers. The insulating layers may be formed from rigidized material that includes various combinations of fiberglass, woven glass, matte glass, cotton paper, phenolic cotton paper, polyester, epoxies, epoxy resins, and the like. Each conductive layer may include one or more conductive electronic signal traces, electric power or ground traces, one or more signal, power, or ground pads, full or partial power planes, or full or partial ground planes. The conductive layers may be formed from metals typically including copper, but also including nickel, aluminum, gold, silver, palladium, zinc, tin, lead, and the like. In addition, the printed circuit board 34 may include plated through hole vias, blind vias, buried vias, and the like. The printed circuit board 34 is positioned beneath the display 14 and the solar cell 26 of the display stack.

The electrical connectors 36, as shown in FIG. 5, provide an electrical connection electrically coupling the printed circuit board 34 with components of the electronic device 10. For example, the electrical connectors 36 may provide an electrical connection between the location determining element 18 positioned on the printed circuit board 34 and the signal feed F1 (loc.) and the electrical ground G1 (loc.) and the electrical ground G2 (loc.) for the location determining antenna 30. Similarly, the electrical connectors 36 may provide an electrical connection between the communication element 20 positioned on the printed circuit board 34 to and the signal feed F2 (comm.) and the electrical ground G1 (comm.) and the electrical ground G2 (comm.) for the communication antenna 32. The electrical connectors 36 may be electrical wires, multiconductor electrical cables, pins such as pogo pins, and the like, formed metals or metal alloys and may be rigid or flexible.

During operation of the electronic device 10, the location determining antenna 30 receives location signals from which the location determining element 18 determines a current geolocation of the electronic device 10. The communication antenna 32 transmits and receives communication signals such as Bluetooth™, WiFi, cellular telecom, or the like. At the same time, the first region 52 and the second region 54 of solar cell 26 receive sunlight or ambient light and generates electric power that may be used to charge or re-charge the battery within the electronic device that is a source of electrical power for components of the electronic device 10. In addition, the higher level of transparency of the second region 54, the first opening 56 and the second opening 58 of the photovoltaic layer 48 compared to the transparency of the first region 52 allows sufficient light from a backlight to be transmitted so that information presented on the display 14 is easily viewable by the user of the electronic device 10 through display cover 46. As the first filler 60 and the second filler 62 each have a level of transparency substantially similar to that of the second region 54, the first opening 56 and the second opening 58 are not visibly obvious or discernable to the user when viewing information presented on display 14. With the location determining antenna 30 and the communication antenna 32 being formed by the first opening 56 and the second opening 58, respectively, within the photovoltaic layer 48 of the solar cell 26 and positioned away from the side wall 40 and the bezel 44, the housing 12 and the bezel 44 can be formed from any material, such as electrically conductive metals or metal alloys, without causing significant interference or reduction in performance or quality of signals transmitted or received by the electronic device 10.

Figure 6:
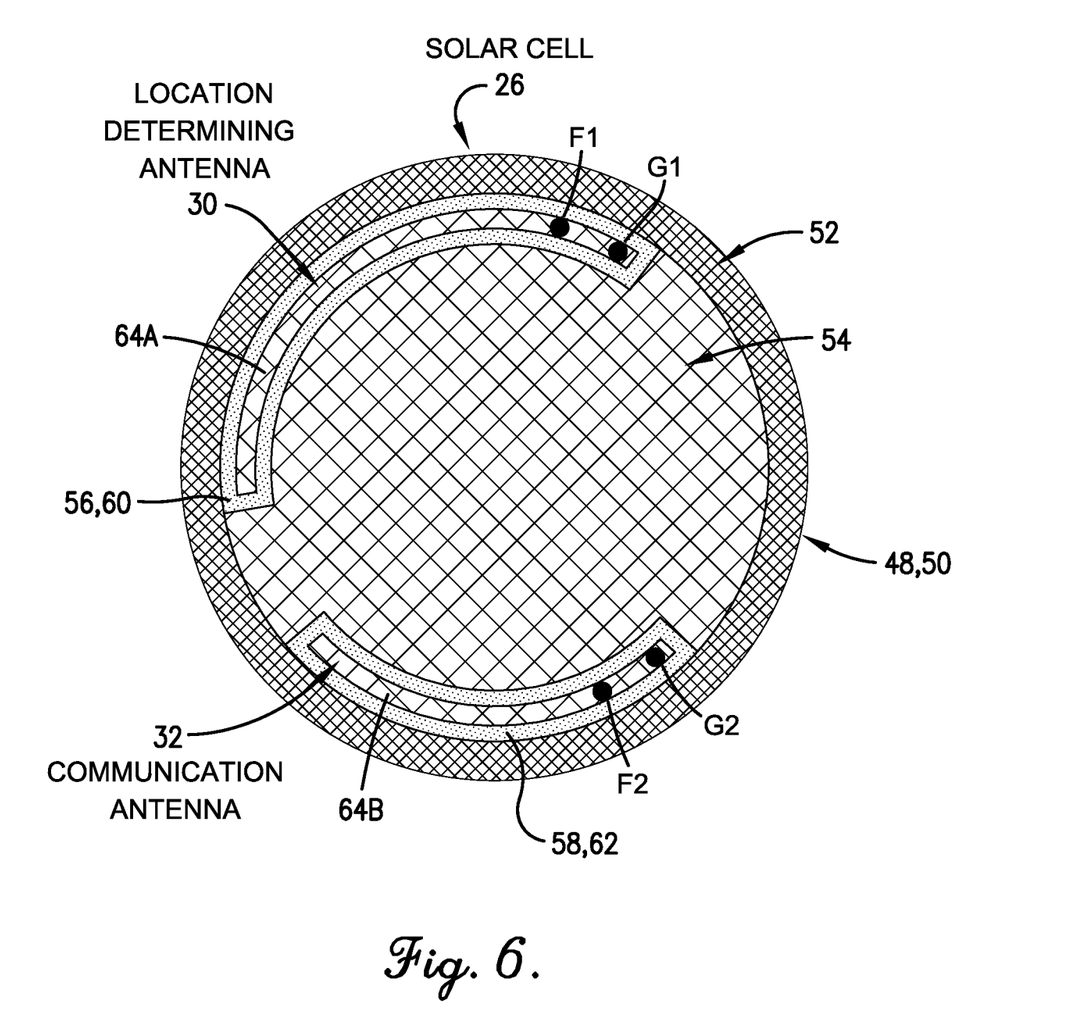
FIG. 6 is a top view of the solar cell including the photovoltaic layer and a second embodiment of the location determining antenna and the communication antenna.

In a second embodiment, as shown in FIG. 6, the first opening 56 and the second opening 58 may contain portions of the photovoltaic layer 48 on which the location determining antenna 30 and the communication antenna 32, respectively, are implemented as inverted-F antennas. Typically, an inverted-F antenna includes a radiating arm that is electrically connected to an electrical ground at one end of the arm and electrically connected to a signal feed at another point on the arm that is spaced apart from the electrically grounded end of the arm. In addition, the arm typically requires some clearance from other electrically conductive structures. In embodiments, the location determining antenna 30 is positioned on a portion of the photovoltaic layer 48 that was not removed from the first opening 56, and the communication antenna 32 is positioned on a portion of the photovoltaic layer 48 that was not removed from the second opening 58. The length of the arm 64A of the location determining antenna 30 is proportional to, corresponds to, varies according to, or is approximately equal to, a wavelength, or a portion thereof, such as a quarter wavelength, of the location signal that is received by the location determining antenna 30. Similarly, the length of the arm 64B of the communication antenna 32 is proportional to, corresponds to, varies according to, or is approximately equal to, a wavelength, or a portion thereof, such as a quarter wavelength, of the communication signals that are transmitted and received by the communication antenna 32. Given that the exemplary location determining antenna 30 is configured to have a length that is substantially one-fourth of a wavelength of the location signal, the length or arc length of the arm 64A of the location determining antenna 30 is approximately one-fourth the wavelength of the 1575 MHz location signal. Similarly, communication antenna 32 have a length that is substantially one-fourth of a wavelength of the LTE communication signal, the length or arc length of the arm 64B of the communication antenna 32 is approximately one-fourth the wavelength of the 1700 MHz communication signal.

As with the first embodiment of the antennas 30, 32, the second embodiment of the location determining antenna 30 and the communication antenna 32 may not allow rectangular shaped first opening 56 or second opening 58 to fit on the photovoltaic layer 48 due to the limitations of the diameter of the electronic device 10. Thus, the first opening 56 and arm 64A of the location determining antenna 30 may have a curved or partial annular shape in order to fit within the photovoltaic layer 48 of the electronic device 10. Similarly, the second opening 58 and arm 64B of the communication antenna 32 may have a curved or partial annular shape in order to fit within the photovoltaic layer 48 of the electronic device 10. In embodiments, the arc length of the first opening 56 and second opening 58 may include a clearance factor, wherein the clearance factor may be a fixed length or a percentage of the half wavelength of the location signal and the communication signal, respectively. The width of the first opening 56 may be approximately equal to a width of the arm 64A of the location determining antenna 30 plus the clearance factor and the width of the second opening 58 may be approximately equal to a width of the arm 64B of the communication antenna 32 plus the clearance factor.

Referring to FIG. 6, the location determining antenna 30 includes an electrical ground G1 (loc.) and an electrical ground G2 (loc.) connection to the arm 64A at, or adjacent to, one of the ends thereof. The location determining antenna 30 includes a signal feed F1 (loc.) electrically connected to the arm 64A at a point that is spaced apart from the electrical ground G1 (loc.) connection and the electrical ground G2 (loc.) connection. The signal feed F1 (loc.) provides the location electronic signal that is communicated to the location determining element 18. Similarly, the communication antenna 32 includes an electrical ground G1 (comm.) and electrical ground G2 (comm.) connection to the arm 64B at, or adjacent to, one of the ends thereof. The communication antenna 32 includes a signal feed F2 (comm.) electrically connected to the arm 64B at a point that is spaced apart from the electrical ground G1 (comm.) connection and the electrical ground G2 (comm.) connection. The signal feed F2 provides the communication signal that is transmitted or received by the communication element 20.

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

What is claimed is:

1. An electronic device comprising:
a housing including a bottom wall and a side wall coupled to the bottom wall, the side wall and the bottom wall defining a portion of an internal cavity;
a display stack including a display cover and a solar cell configured to output an electric power having a power level corresponding to an intensity of light received by the solar cell;
a bezel coupled to an upper edge of the side wall of the housing, the bezel enclosing the display cover; and
a first antenna configured to wirelessly transmit signals, receive signals, or transmit and receive signals;
wherein the solar cell includes a substrate and a photovoltaic layer, the photovoltaic layer including a mesh of electrically conductive material positioned on the substrate and a first opening within the mesh; and
wherein the first antenna is formed by the first opening of the photovoltaic layer.

2. The electronic device of claim 1, wherein the first antenna is a slot antenna partially formed by a circumference of the first opening.

3. The electronic device of claim 2, wherein there is an absence of the mesh in the first opening above the substrate.

4. The electronic device of claim 2, wherein the first opening for the first antenna has a length, the length being a fraction of a wavelength of the signals transmitted, received, or transmitted and received by the first antenna.

5. The electronic device of claim 1, wherein the first opening has a partial annular shape, the partial annular shape having a substantially uniform width and an arc length being a fraction of a wavelength of the signals transmitted, received, or transmitted and received by the first antenna.

6. The electronic device of claim 1, wherein the first opening is filled with an electrically insulating material.

7. The electronic device of claim 6, wherein
the solar cell includes a first region having an annular shape and positioned along a perimeter of the substrate, and
the solar cell includes a second region that is positioned in an area enclosed by the first region.

8. The electronic device of claim 7, wherein the first opening is positioned in the second region, and wherein the electrically insulating material has a level of transparency roughly equal to a level of transparency of the second region.

9. The electronic device of claim 1, further comprising a display positioned below the solar cell and configured to display information.

10. The electronic device of claim 1, wherein
the photovoltaic layer includes a second opening within the mesh, the second opening, and
the electronic device further comprises a second antenna configured to wirelessly transmit wireless signals, receive wireless signals, or transmit and receive signals, the second antenna formed by the second opening of the photovoltaic layer.

11. The electronic device of claim 10, wherein the first antenna is configured to receive location signals and the second antenna is configured to transmit and receive communication signals.

12. The electronic device of claim 10, wherein the second antenna is a slot antenna formed by a circumference of the second opening, and wherein there is an absence of the mesh in the second opening above the substrate.

13. The electronic device of claim 1, wherein the side wall is formed from electrically conductive material.

14. The electronic device of claim 1, wherein the bezel is formed from electrically conductive material.

15. An electronic device comprising:
a location determining element configured to determine a current geolocation of the electronic device based on location signals;
a housing including a bottom wall and a side wall coupled to the bottom wall, the side wall and the bottom wall defining a portion of an internal cavity;
a display stack including a display cover and a solar cell configured to output an electric power having a power level corresponding to an intensity of light received by the solar cell;
a bezel coupled to an upper edge of the side wall of the housing, the bezel enclosing the display cover; and
an antenna electrically coupled with the location determining element and configured to receive the location signals;
wherein the solar cell includes a substrate and a photovoltaic layer, the photovoltaic layer including a mesh of electrically conductive material positioned on the substrate and an opening having a partial annular shape within the mesh; and
wherein the antenna is formed by the opening of the photovoltaic layer.

16. The electronic device of claim 15, wherein the partial annular shape having a substantially uniform width, and wherein the opening has an arc length that is approximately equal to one-half of a wavelength of the location signals.

17. The electronic device of claim 15, wherein the first opening is filled with an electrically insulating material, and wherein the electrically insulating material has a level of transparency roughly equal to a level of transparency of the photovoltaic layer.

18. The electronic device of claim 15, wherein bottom wall, the side wall and the bezel are formed of electrically conductive material.

19. An electronic device comprising:
- a location determining element configured to determine a current geolocation of the electronic device based on location signals;
- a communication element configured to communicate with other electronic devices;
- a housing including a bottom wall and a side wall coupled to the bottom wall, the side wall and the bottom wall defining a portion of an internal cavity;
- a display stack including a display cover and a solar cell configured to output an electric power having a power level corresponding to an intensity of light received by the solar cell;
- a bezel coupled to an upper edge of the side wall of the housing, the bezel enclosing the display cover;
- a first antenna electrically coupled with the location determining element and configured to receive location signals; and
- a second antenna electrically coupled with the communication element and configured to transmit and receive communication signals;
- wherein the solar cell includes a substrate and a photovoltaic layer, the photovoltaic layer including a mesh of electrically conductive material positioned on the substrate, a first opening having a partial annular shape within the mesh and a second opening having a partial annular shape within the mesh;
- wherein the first antenna is formed by the first opening of the photovoltaic layer, the first opening having an arc length that is approximately equal to one-half of a wavelength of the location signals; and
- wherein the second antenna is formed by the second opening of the photovoltaic layer, the second opening having an arc length that is approximately equal to one-half of a wavelength of the communication signals.

20. The electronic device of claim 19, wherein the first opening and the second opening are filled with an electrically insulating material, and wherein the electrically insulating material has a level of transparency roughly equal to a level of transparency of the photovoltaic layer.

* * * * *